United States Patent [19]

Berkman et al.

[11] 4,334,948
[45] Jun. 15, 1982

[54] METHOD OF AND APPARATUS FOR GROWING CRYSTAL RIBBON

[75] Inventors: Samuel Berkman, Florham Park; Robert Metzl, Hamilton Square, both of N.J.

[73] Assignee: RCA Corporation, New York, N.Y.

[21] Appl. No.: 237,414

[22] Filed: Feb. 23, 1981

[51] Int. Cl.³ .............................................. C30B 15/34
[52] U.S. Cl. ............................ 156/608; 156/DIG. 88; 422/246
[58] Field of Search ......... 156/608, 617 SP, DIG. 88; 422/246, 249

[56] References Cited

U.S. PATENT DOCUMENTS

| | | | |
|---|---|---|---|
| 3,870,477 | 3/1975 | Labelle, Jr. ......................... | 156/608 |
| 3,915,656 | 10/1975 | Mlavsky et al. ..................... | 156/608 |
| 4,022,652 | 5/1977 | Hirano et al. ....................... | 156/608 |
| 4,246,064 | 1/1981 | Dewees et al. ...................... | 156/608 |
| 4,269,652 | 5/1981 | Yancey ................................ | 156/608 |
| 4,271,129 | 6/1981 | Berkman et al. ..................... | 422/246 |

*Primary Examiner*—Gregory N. Clements
*Attorney, Agent, or Firm*—Birgit E. Morris; Donald S. Cohen; Robert P. Seitter

[57] ABSTRACT

A method and apparatus for growing crystal ribbon from a liquid melt by the EFG technique includes the use of a die having a capillary feed passage adjacent the ribbon pulling mechanism and gas scrubbing passages on each side of the capillary feed passage. Thus, gas entrapped in the liquid melt can diffuse through the gas scrubbing passages to minimize the presence of microvoids in the ribbon. In a particular embodiment, the capillary die can include lateral communicating passages between the capillary feed passage and the gas scrubbing passage so that gas in the capillary feed passage can diffuse out to the gas scrubbing passage.

12 Claims, 4 Drawing Figures

METHOD OF AND APPARATUS FOR GROWING CRYSTAL RIBBON

BACKGROUND OF THE INVENTION

This invention relates to a method of and apparatus for growing crystal ribbons by the EFG (Edge-defined Film-fed Growth) technique. The EFG process has been used to grow ribbons of various crystalline materials from liquid melts. Ribbons so grown usually include microvoids formed from gas in the melt that becomes trapped in the ribbon as it forms. The presence of these microvoids is not always acceptable. For example, sapphire ribbon, grown from a liquid melt of aluminum oxide ($Al_2O_3$) is cut into wafers and these wafers are used as substrates on which silicon is grown. The resulting silicon-on-sapphire (SOS) wafers are processed to include integrated electronic circuits. The presence of microvoids, particularly those of relatively large size, in the sapphire has a detrimental affect on the performance of the circuits. In order to reduce the number and size of the microvoids, the raw material that eventually forms the melt and the chamber in which the melt is formed have been subjected to various outgassing techniques to eliminate trapped gases. These techniques have helped, but have not eliminated or consistently minimized the presence of microvoids in the ribbons.

SUMMARY OF THE INVENTION

In accordance with this invention there is provided a method and apparatus for growing crystal ribbons by an EFG process wherein the number and size of microvoids in the ribbon are significantly reduced. There is also provided a particular die configuration that is useful in carrying out a method in accordance with this invention.

According to the invention there is provided a die having at least one capillary passage terminating, at one end, in growth control surfaces and further having a pair of gas scrubbing passages, one on each side of the capillary passage. The die thus provided is located in a crucible into which is fed a quantity of crystalline raw material which is heated to form a liquid melt. The liquid melt flows through a channel formed between the bottom of the crucible and the other end of the die and, by capillary action, columns of liquid melt are formed in the capillary passage and in the gas scrubbing passages. As the liquid melt flows through the channel, a significant amount of the gas entrapped therein diffuses up the gas scrubbing passages so that gas flowing into the capillary passage is significantly reduced. Once the liquid melt is established in the capillary passage, a crystal seed is located adjacent the growth control surfaces and is then pulled away from those surfaces at a rate to grow the ribbon.

A particular die useful in growing the ribbon in accordance with the method of this invention comprises a plurality of plate members arranged in parallel spaced apart relationship to define the capillary passage and the gas scrubbing passages. The plates forming the capillary passage are formed with the growth control surfaces at one end and, at the opposite end, all of the plates are formed with spacer legs so that the adjacent ends of the passages can form, with the bottom of the crucible, the channel that communicates with the liquid melt. Lateral passage means is formed in some of the plate members intermediate the ends thereof so that the capillary passage communicates with the gas scrubbing passages. In this way, any gas in the capillary passage can diffuse out through the lateral passage means to the gas scrubbing passages.

BRIEF DESCRIPTION OF THE DRAWING

For a better understanding of the invention, reference is made to the following description of a preferred embodiment thereof, taken in conjunction with the figures of the accompanying drawing, in which.

DETAILED DESCRIPTION OF THE PREFERRED EMBODIMENT

Figure 1:
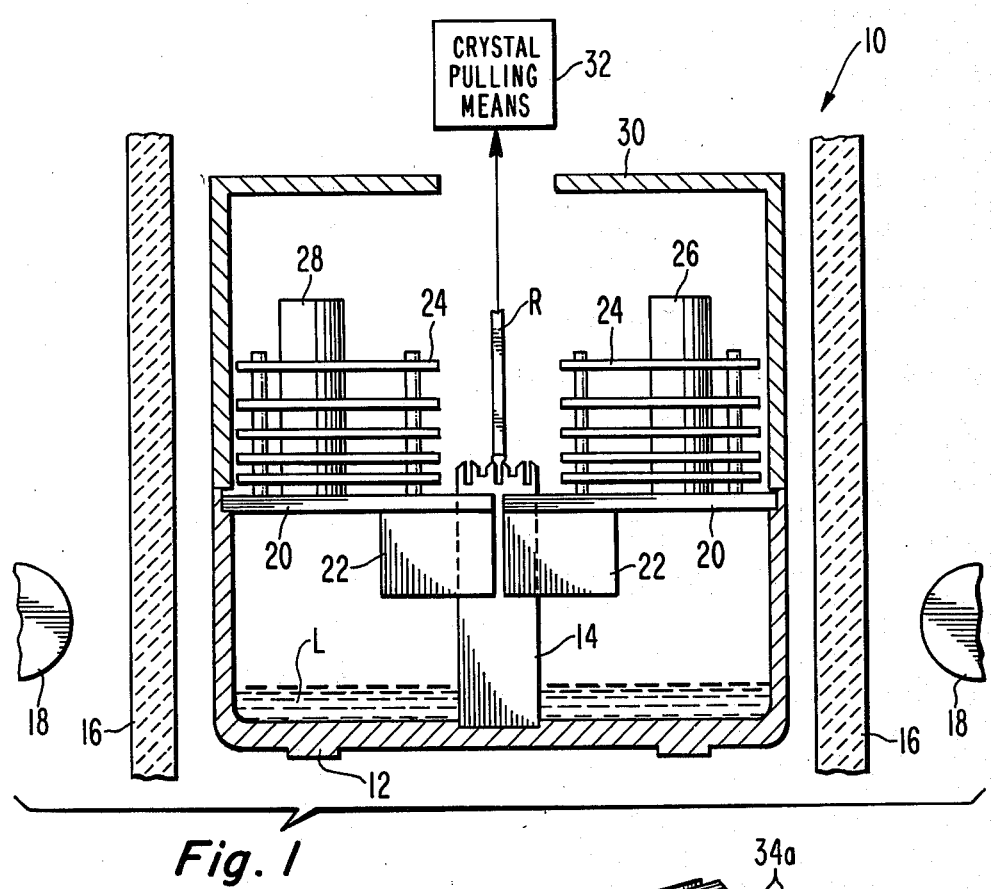
FIG. 1 is a front elevation view, partially in section, illustrating apparatus for practicing a method in accordance with this invention.

Referring to FIG. 1 of the drawing, there is disclosed a portion of a system 10 for growing a crystal ribbon R from a liquid melt L by the EFG technique. Included in the system 10 is a crucible 12 in which the liquid melt L is contained and in which a die member 14 used to grow the ribbon R is also contained. The crucible 12 can be supported by a pyrolitic graphite support plate and a quartz pedestal (neither of which is illustrated in the drawing) as disclosed in the copending application of Samuel Berkman et al., Ser. No. 038,829, filed May 14, 1979 now U.S. Pat. No. 4,251,206 and entitled APPARATUS FOR AND METHOD OF SUPPORTING A CRUCIBLE FOR EFG GROWTH OF SAPPHIRE. As is generally conventional in the art, the crucible 12 is surrounded by a heat shield 16 which in turn, is surrounded by an induction heating coil 18, only a portion of which is shown, that is used to heat the crucible and its contents to maintain the melt in its liquid state.

The open side of the crucible 12 is covered by a pair of cover plates 20, 20 which define a substantially closed crucible volume. The cover plates 20, 20 are shaped to fit around the die member 14 and the die member is sized to extend through the cover plates beyond the outer surfaces thereof. Inside the closed crucible volume are heat deflectors 22, 22 of the type disclosed in the copending application of Samuel Berkman et al., Ser. No. 081,040, filed Mar. 6, 1979 now U.S. Pat. No. 4,271,129 and entitled HEAT RADIATION DEFLECTORS WITHIN AN EFG CRUCIBLE. As explained there, these heat deflectors 22, 22 modify the thermal gradient along the growth control surfaces that is, the top surfaces, of the die member 14. On the outside of the cover plates 20, 20 are stacks of heat shields 24, 24, a material feed tube 26 for feeding raw material into the crucible 12 and a tube 28 for sensing the level of the liquid melt L and controlling the flow of raw material through the feed tube into the crucible. The structure on the outside surface of the cover plates 20 is enclosed by a cage member 30 seated on the upper edge of the crucible 12. The heat shields 24, 24, the tubes 26 and 28 and the cage member 30 are also explained in application Ser. No. 081,040.

Located above the cage member 30 is a crystal pulling apparatus 32 of any generally conventional type. Such apparatus as 32, generally includes a seed holder carrying a crystal seed on which the ribbon R of crystal is to be grown and a pulling mechanism for pulling the seed upwardly away from the die member 14 at a rate to grow ribbon.

As should be understood by those skilled in the art, the liquid melt L is maintained at a temperature which is higher than the crystallization temperature of the material being grown. In this way, raw material introduced through the feed tube 26 to the crucible 12 will melt and become part of the liquid melt L. In addition, it should be understood that the liquid melt fills the die member 14 and is similarly maintained at a temperature sufficiently high so that it will not crystallize therein. Actual crystallization occurs just above the growth control surfaces of the die member.

Figure 2:
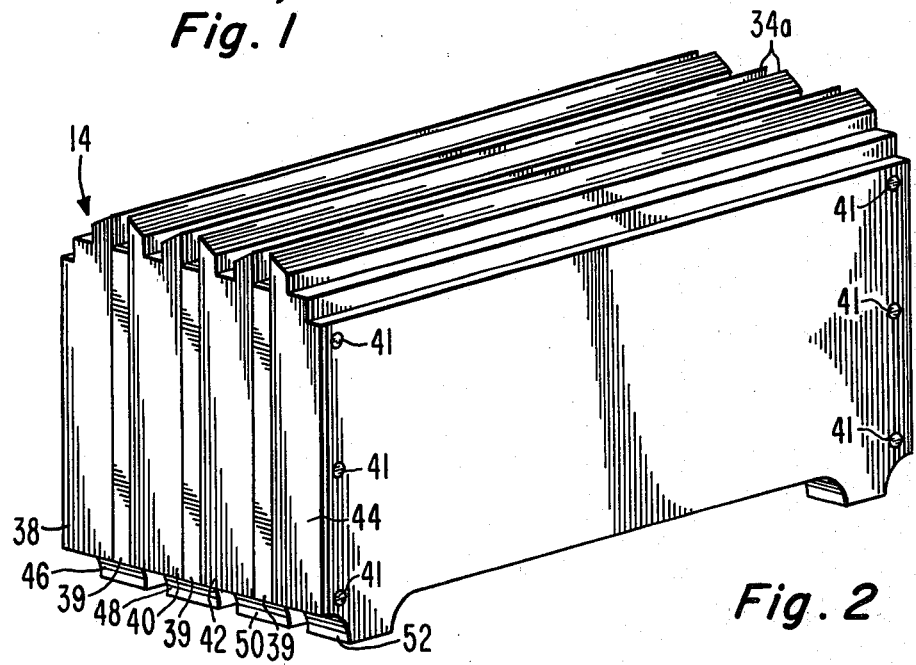
FIG. 2 is a perspective view of a portion of the die member illustrated in FIG. 1.
Figure 3:
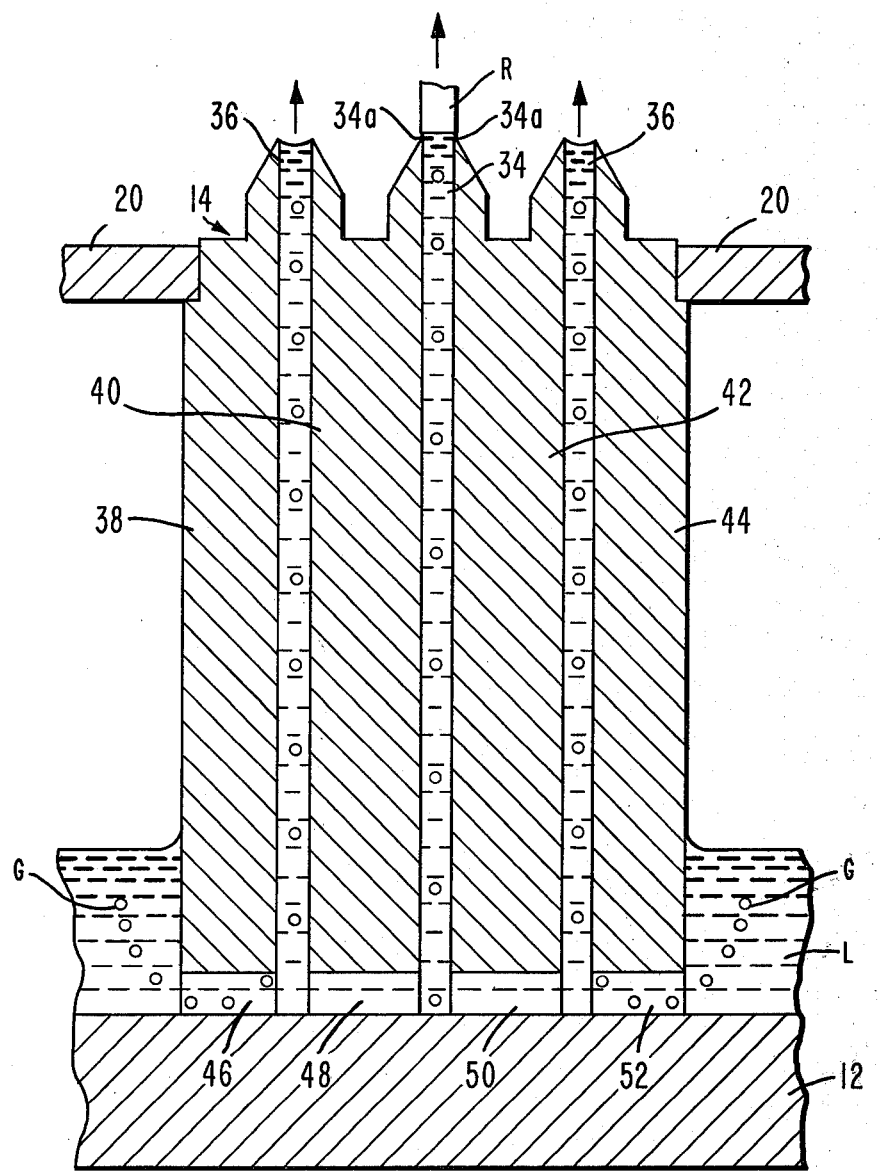
FIG. 3 is an enlarged section view of the die member illustrated in FIG. 1; and, FIG. 4 is an enlarged section view of another embodiment of a die member particularly useful in practicing a method in accordance with this invention.

Referring now to FIGS. 2 and 3, the die member 14 can be seen to include a central capillary passage 34 and a pair of gas scrubbing passages 36, 36, one on each side of the capillary passage. As is generally conventional, the die member 14 is made up of a plurality of relatively thin, rectangular plates 38, 40, 42 and 44 secured together in spaced apart, face-to-face relationship by spacer members 39, and fastener members 41 to define the various passages. The various plate members 38, 40, 42 and 44 are shaped with support leg members 46, 48, 50 and 52, respectively, adjacent their lower elongated edges. The interior plates 40 and 42 are formed adjacent their upper edge with growth control surfaces 34a, 34a that cooperate in a conventional manner in growing the ribbon R.

It should be understood that when the die member 14 is placed in the crucible 12, the support leg members 46, 48, 50 and 52 rest on the crucible's bottom surface such that the lower elongated edge of the plate members are spaced from that bottom surface forming a channel therebetween. The various passages 34 and 36 communicate with the liquid melt L in the crucible through this channel. With the die member 14 thus located in the crucible 12, the liquid melt L flows through this channel and wets the inside surfaces of the passages 34 and 36. Thus, the liquid melt L flows by capillary action through the passages 34 and 36 establishing columns of liquid therein as shown in FIG. 3. In addition, any gas entrapped in the liquid L, denoted by the bubbles G in FIG. 3, is carried along in the liquid as it flows from outside the die member 14 to the passages 34 and 36. As the gas G flows past the gas scrubbing passages 36, much of it diffuses into these passages. Eventually, gas in the passages 36 will diffuse out the upper end of the die member 14 into the atmosphere. Some gas G will be carried along with the liquid into the capillary passage 34 and will form microvoids in the ribbon R. However, since much of the gas diffuses out through the gas scrubbing passages 36, these microvoids are significantly reduced.

Figure 4:
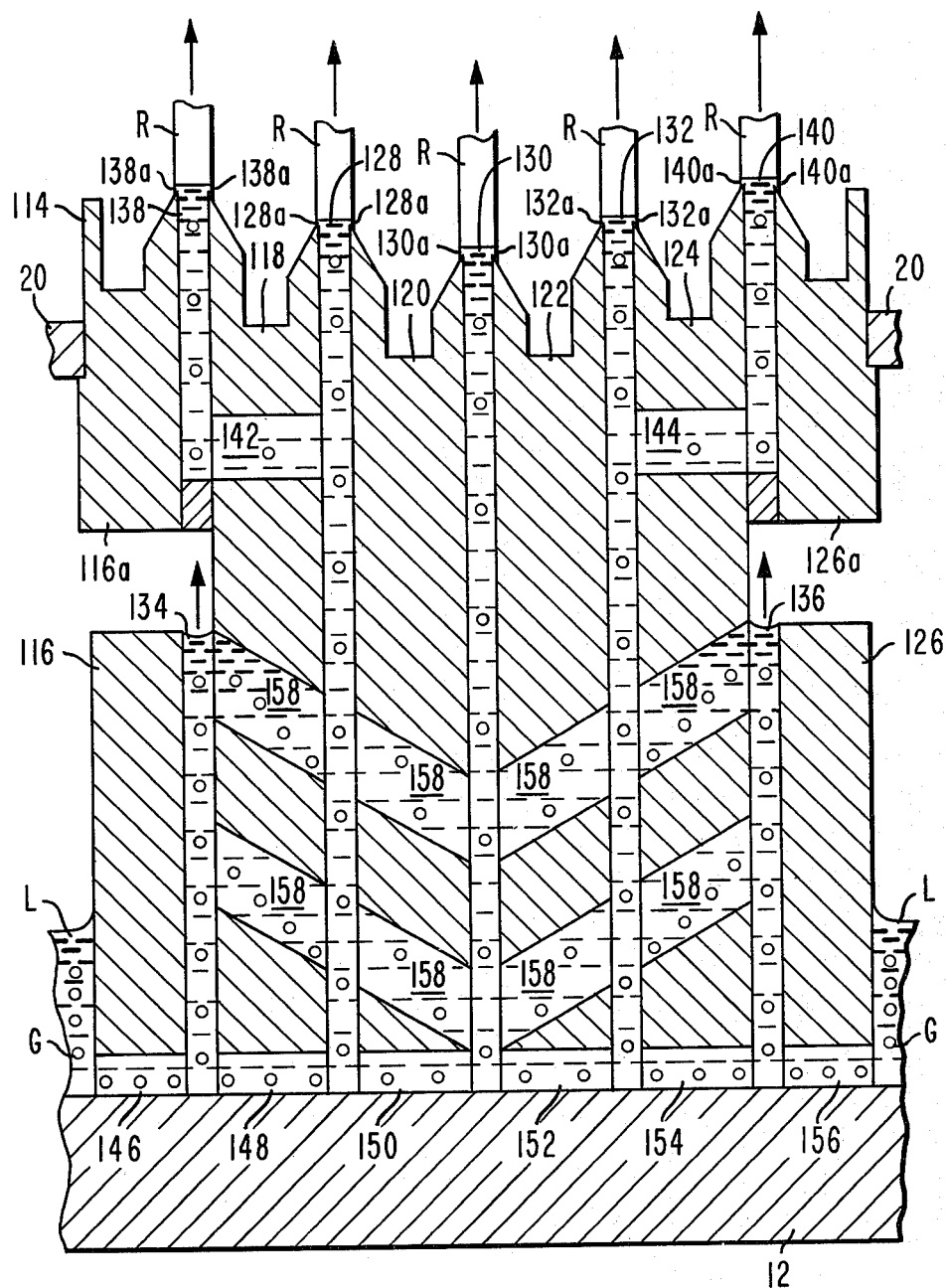

In the explanation of the invention thus far provided the die member 14 is a generally conventional one designed for growing multiple ribbons of material. Only the central passage, however, is used for the ribbon pulling and the outer two are used as gas scrubbing passages. It is expected that even better results can be obtained by utilizing the die member 114 illustrated in FIG. 4 of the drawing. This die member 114 is made up of a plurality of relatively thin, rectangular plate members 116, 116a, 118, 120, 122, 124, 126 and 126a. The plate members 118, 120, 122 and 124 are of a generally uniform length secured in spaced apart relationship to define capillary passages 128, 130 and 132. These passages 128, 130 and 132 terminate adjacent the upper elongated edge of the plates, that is, adjacent the exterior surface of cover plates 20 in growth control surfaces 128a, 130a and 132a utilized to form the ribbons R of crystal material. The plates 116 and 116a and, similarly, the plates 126 and 126a are arranged one above the other in spaced apart relationship with each other. The plates 116 and 126 are adjacent the lower edge of the die member 114, that is, adjacent the bottom surface of the crucible 12 and the plates 116a and 126a are adjacent the upper edge of the die member. The plate 116 and the adjacent portion of the plate 118 are secured together in spaced apart relationship and form a gas scrubbing passage 134 and the plate 126 and the adjacent portion of plate 124 are secured together in spaced apart relationship and form a gas scrubbing passage 136. The passages 134 and 136 terminate adjacent the lower edges of the die member at one end and between the upper and lower edges of the die at their other end, preferably within the closed volume of the crucible 12.

The plate 116a and the adjacent portion of the plate 118 are also secured together in spaced apart relationship and form an additional capillary passage 138. Similarly, the plate 126a and the adjacent portion of the plate 124 are secured together in spaced apart relationship and form still another capillary passage 140. These passages 138 and 140 are formed with growth control surfaces 138a and 140a generally adjacent the growth control surfaces 128a, 130a and 132a of the other passages and are closed at the end adjacent the plates 116 and 126. In addition, these passages 138 and 140 communicate with their adjacent passages 128 or 132 through their associated lateral feeder passages 142 or 144 formed in their adjacent plates 118 or 124. Thus, liquid melt in the passages 128 and 132 flows into the passages 138 and 140 and up to growth control surfaces 138a, 140a whereby five ribbons R can be grown from this die configuration.

Adjacent their lower elongated edges, the plates 116, 118, 120, 122, 124 and 126 are formed with support leg members 146, 148, 150, 152, 154 and 156, respectively, that space these edges from the inner surface of the crucible 12 to form a channel between these edges and the crucible. Liquid melt L can now flow from the outside of the die, through this channel to the capillary passages 128, 130 and 132 and then to the capillary passages 138 and 140. The plate members 118, 120, 122 and 124 are each formed with a plurality of lateral passages 158 so that the gas scrubbing passage 134 communicates with the capillary passage 128 and that passage in turn communicates with the passage 130. Similarly, the gas scrubbing passage 136 communicates with the capillary passage 132 which, in turn, communicates with the capillary passage 130.

As with the embodiment of FIGS. 2 and 3, gases G diffuse through the gas scrubbing passages 134 and 136 as the liquid melt flows to the capillary passages 128, 130 and 132. Some gases G also flow with the liquid melt L up the capillary passages 128, 130 and 132, and some of the gases in these passages now diffuse laterally through the passages 158 to their outermost adjacent passages including the gas scrubbing passages 134 and 136. Preferably, the lateral passages 158 are inclined upwardly at an angle from the capillary passages 128, 130 and 132 toward the gas scrubbing passages 134 and 136. In this way the diffusion of the gases G from the capillary passage to the outermost adjacent passage is facilitated. With this arrangement, the presence of microvoids in the ribbons R grown with this die is reduced even further since gases are additionally scrubbed from the capillary passages from which the ribbons are grown. It should be understood, of course, that for best results, the rate of pulling the ribbon R should be somewhat slower than the duffusion rate of the gases to allow the maximum amount of gas to diffuse out.

While in the foregoing there have been disclosed several preferred embodiments of the invention, it should be obvious to those skilled in the art that various changes and modifications can be made without departing from the true spirit and scope of the invention as recited in the appended claims.

We claim:

1. Apparatus for growing a ribbon of crystal material, said apparatus comprising:
a crucible adapted to contain a liquid melt;
a die located in said crucible, said die having at least one capillary passage, a pair of gas scrubbing passages, and lateral passages between said capillary passage and said gas scubbing passages for diffusing gas in said capillary passage to said gas scrubbing passages, one of said gas scrubbing passages being adjacent each side of said capillary passage, one end of said passages being adjacent the bottom of said crucible whereby said one ends are submerged in any liquid melt therein, the other end of said passages being located above the liquid melt whereby any liquid melt in said crucible establishes a column of liquid in said passages with gases trapped therein diffusing upwardly along said gas scrubbing passages;
crystal seed pulling means adjacent said capillary passage only for pulling a crystal seed away from said capillary passage at a rate to grow the ribbon.

2. Apparatus in accordance with claim 1 wherein said lateral passages extend upwardly at an angle from said capillary passage to said gas scrubbing passages.

3. Apparatus in accordance with claim 1 wherein said gas scrubbing passages are shorter than said capillary passage and wherein additional capillary passages are adjacent said gas scrubbing passages and additional crystal seed pulling means adjacent said additional capillary passages, said capillary passage and said additional capillary passages being in communication whereby said additional capillary passages are fed with liquid from said one capillary passage.

4. A method of growing a ribbon of crystal material, said method comprising:
providing a die having at least one capillary passage and a pair of gas scrubbing passages, one of said gas scrubbing passages being adjacent each side of said capillary passage;
locating said die in a crucible;
feeding a quantity of crystalline raw material into said crucible and heating said material to form a liquid melt;
establishing, by capillary action, columns of liquid melt in said capillary passage and in said gas scrubbing passages with gases dissolved in the melt diffusing through said gas scrubbing passages;
inserting a crystal seed into the liquid melt in said capillary passage and then pulling said seed away from said capillary passage at a rate to grow said ribbon.

5. A method in accordance with claim 4 wherein said die is located in said crucible to provide a channel between the bottom surface of the crucible and the lower edge of the die.

6. A method in accordance with claim 4 wherein a lateral passage is provided between said gas scrubbing passages and said capillary passage so that gases in said liquid in said capillary passage diffuse through said lateral passage to said gas scrubbing passages.

7. A method in accordance with claim 4 wherein additional capillary passages are provided adjacent said one capillary passage and in communication therewith, said additional capillary passages terminating intermediate the edges of said die and adjacent said gas scubbing passages, establishing columns of liquid in each of said additional capillary passages from said one capillary passage and inserting an additional crystal seed into each of said additional capillary passages and then pulling said additional seeds away from said additional capillary passages at a rate to grow said ribbon.

8. A die for use in growing a ribbon of crystal material, said die comprising a plurality of relatively thin, elongated plate members arranged in parallel, spaced apart relationship to define at least one capillary passage and a gas scrubbing passage on opposite sides thereof, said plate members forming said capillary passage having growth control surfaces at one end thereof, said plate members being formed with support legs at the other end thereof whereby said die can be supported in a crucible so that said passages can communicate with liquid therein, lateral passages being formed in some of said plate members intermediate the elongated edges thereof whereby said capillary passage communicates with said gas scrubbing passages.

9. A die in accordance with claim 8 wherein said lateral passages extend through said plates at an incline.

10. A die in accordance with claim 8 wherein the outermost plate members forming said gas scrubbing passages are shorter than said other plate members whereby said gas scrubbing passages are shorter than said capillary passage.

11. A die in accordance with claim 10 including additional plate members axially aligned with said outermost plate members to form additional capillary passages adjacent said gas scrubbing passages, and lateral feeder passages communicating between said one capillary passage and said additional capillary passages.

12. A die in accordance with claim 8 wherein said plate members define a plurality of capillary passages in between said gas scrubbing passages and wherein lateral passages are also formed in said plate members defining adjacent capillary passages, said lateral passages being formed intermediate the elongated edges of said plate members defining adjacent capillary passages.

* * * * *